(12) United States Patent
Lien

(10) Patent No.: US 6,441,651 B2
(45) Date of Patent: *Aug. 27, 2002

(54) HIGH VOLTAGE TOLERABLE INPUT BUFFER

(75) Inventor: Chuen-Der Lien, Los Altos Hills, CA (US)

(73) Assignee: Integrated Device Technology, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/504,478

(22) Filed: Feb. 14, 2000

Related U.S. Application Data

(63) Continuation of application No. 08/649,898, filed on May 2, 1996, now Pat. No. 6,104,229.

(51) Int. Cl.$^7$ .............................................. H03K 5/153
(52) U.S. Cl. ............................................. 327/78; 327/89
(58) Field of Search ............................. 327/77, 89, 79, 327/78, 563; 330/261

(56) References Cited

U.S. PATENT DOCUMENTS

| | | | |
|---|---|---|---|
| 4,199,695 A | 4/1980 | Cook et al. ................... 327/291 |
| 4,208,639 A | * 6/1980 | Stickel ................. 331/116 FE |
| 4,438,349 A | 3/1984 | Shoji .......................... 327/85 |
| 4,508,978 A | 4/1985 | Reddy ........................ 327/294 |
| 4,571,504 A | 2/1986 | Iwamoto et al. ............. 327/389 |
| 4,631,429 A | 12/1986 | Riebeek ........................ 327/63 |
| 4,677,312 A | 6/1987 | Freeman ..................... 327/108 |
| 4,689,504 A | 8/1987 | Raghunathan et al. ......... 326/81 |
| 4,694,341 A | 9/1987 | Soneda et al. ................ 327/91 |
| 4,698,526 A | 10/1987 | Allan ........................... 326/71 |
| 4,791,324 A | 12/1988 | Hodapp ........................ 327/66 |
| 4,831,596 A | 5/1989 | Tran ...................... 365/230.06 |
| 4,926,068 A | 5/1990 | Fujita ........................... 327/72 |
| 5,021,750 A | 6/1991 | Schnabel ..................... 331/111 |
| 5,124,666 A | 6/1992 | Liu et al. ..................... 330/253 |
| 5,160,860 A | 11/1992 | Rundldue ..................... 326/98 |
| 5,218,247 A | 6/1993 | Ito et al. ....................... 326/83 |
| 5,264,744 A | 11/1993 | Mizukami et al. ............ 326/62 |
| 5,268,872 A | 12/1993 | Fujii et al. .................... 327/77 |
| 5,276,361 A | 1/1994 | Bartlett ........................ 326/62 |
| 5,281,869 A | 1/1994 | Lundberg ..................... 326/21 |
| 5,289,054 A | 2/1994 | Lucas .......................... 327/63 |
| 5,300,832 A | 4/1994 | Rogers ......................... 326/57 |
| 5,309,039 A | 5/1994 | Ghassemi et al. .......... 327/542 |
| 5,327,388 A | * 7/1994 | Kobayashi ................. 365/226 |
| 5,336,952 A | 8/1994 | Iwahashi et al. ............ 327/389 |
| 5,339,459 A | 8/1994 | Schiltz et al. ................. 327/94 |
| 5,341,045 A | 8/1994 | Alumulla ..................... 326/68 |
| 5,355,033 A | 10/1994 | Jang ............................. 326/83 |
| 5,361,002 A | 11/1994 | Casper ....................... 327/530 |

(List continued on next page.)

Primary Examiner—Timothy P. Callahan
Assistant Examiner—Terry L. Englund
(74) Attorney, Agent, or Firm—Skjerven, Morrill, MacPherson LLP

(57) ABSTRACT

An input buffer for use in an integrated circuit having a $V_{CC}$ voltage supply and a $V_{SS}$ voltage supply. The input buffer includes a p-channel field effect transistor (FET) having a source region coupled to the $V_{CC}$ voltage supply, a drain region coupled to a bias circuit, and a gate electrode coupled to an input terminal. The bias circuit maintains a voltage at the drain region of the p-channel FET which is slightly greater than the $V_{SS}$ supply voltage when a logic high voltage is applied to the input terminal. In an alternate embodiment, the input buffer includes an n-channel FET having a drain region coupled to the $V_{CC}$ voltage supply, a source region coupled to the output terminal and a gate electrode coupled to the input terminal. The bias circuit maintains a voltage at the source of the n-channel FET which is greater than the $V_{SS}$ supply voltage when a logic low voltage is applied to the input terminal.

5 Claims, 8 Drawing Sheets

U.S. PATENT DOCUMENTS

| | | | |
|---|---|---|---|
| 5,369,313 A | 11/1994 | Yoshira | 326/68 |
| 5,381,061 A | 1/1995 | Davis | 326/57 |
| 5,406,145 A | 4/1995 | Arai et al. | 327/427 |
| 5,457,433 A | 10/1995 | Westwick | 327/427 |
| 5,489,874 A | 2/1996 | Tanoi | 327/560 |
| 5,525,933 A | 6/1996 | Matsuki et al. | 326/23 |
| 5,559,455 A | 9/1996 | McPartland | 327/53 |
| 5,581,206 A | 12/1996 | Chevallier et al. | 327/77 |
| 5,610,538 A | 3/1997 | Kim | 326/87 |
| 5,680,538 A | 10/1997 | Ochi et al. | 327/333 |
| 5,966,035 A | 10/1999 | Lien | 327/89 |
| 6,078,207 A * | 6/2000 | Oguri | 327/58 |
| 6,087,893 A * | 7/2000 | Oowaki et al. | 327/537 |

* cited by examiner

HIGH VOLTAGE TOLERABLE INPUT BUFFER

RELATED APPLICATION

This is a continuation of application Ser. No. 08/649,898 filed on May 2, 1996, now U.S. Pat. No. 6,104,229.

FIELD OF THE INVENTION

The present invention relates to a semiconductor structure which includes an input buffer circuit.

BACKGROUND OF THE INVENTION

Integrated circuits (IC's) include input pads which receive external signals. Each input pad is typically connected to a corresponding input buffer circuit. FIG. 1 is a schematic diagram illustrating a typical input buffer circuit 100 which includes pull-up PMOS transistor 101, pull-down NMOS transistor 102, input pad 103 and internal input node 104. In response to the signal received on input pad 103, input buffer circuit 100 selectively connects internal input node 104 to a $V_{CC}$ voltage supply rail (i.e., a voltage supply rail which receives a first voltage, $V_{CC}$, during normal operating conditions) or to a $V_{SS}$ voltage supply rail (i.e., a voltage supply rail which receives a second voltage, typically ground, during normal operating conditions).

Even if the $V_{CC}$ supply voltage has a voltage of 3.3 volts or less, it is desirable to allow a high input voltage (e.g., 5 volts) to be applied to input pad 103. However, when a high input voltage is applied to input pad 103, NMOS pull-down transistor 102 turns on. As a result, the source and drain of NMOS transistor 102 are each held at the Vss supply voltage (e.g., 0 volts), and the high input voltage is applied across the gate oxide of NMOS transistor 102. The high input voltage across the gate oxide of transistor 102 disadvantageously degrades the lifetime of the gate oxide of NMOS transistor 102.

One method used to solve this problem is to fabricate the gate oxide of each transistor on the IC to a thickness which is sufficient to withstand the applied high input voltage. However, such a thick oxide is typically not compatible with high speed advanced technology.

Another method is to form thick oxide transistors and thin oxide transistors on the same IC. Transistors required to receive high voltages are fabricated with a thick gate oxide. Conversely, transistors which are not required to receive high voltages are given a thin gate oxide to improve the speed of these transistors. However, this method disadvantageously increases process complexity.

It would therefore be desirable to have an input buffer circuit which is capable of receiving a high input voltage without experiencing degradation of gate oxide lifetime. It would further be desirable if such input buffer circuit does not reduce the operating speed of other transistors on the IC, or increase the complexity of the process used to fabricate the IC.

SUMMARY

Accordingly, the present invention provides structures and methods for minimizing the voltage across the gate oxide of transistors used in input buffer circuits.

In one embodiment, the input buffer circuit includes a p-channel field effect transistor (FET) and a bias circuit. The p-channel FET has a source region coupled to the $V_{CC}$ voltage supply, a drain region coupled to the bias circuit, and a gate electrode coupled to receive the input voltage $V_{IN}$. The bias circuit controls the voltage at the drain of the p-channel FET and provides an output signal which effectively transmits the input voltage signal $V_{IN}$ to the on-chip integrated circuitry.

When a high input voltage $V_{IN}$ is applied to the gate electrode of the p-channel FET, the bias circuit maintains the voltage at the drain region of the p-channel FET at a level which is slightly greater than the $V_{SS}$ supply voltage. As a result, the voltage across the gate oxide at the drain of the p-channel FET is reduced. The output signal provided by the bias circuit has a logic low level which is slightly greater than the $V_{SS}$ supply voltage. In one variation, the p-channel FET and the bias circuit form a current mirror circuit.

In another embodiment, the input buffer circuit includes an n-channel FET and a bias circuit. The n-channel transistor has a gate electrode coupled to receive the input voltage $V_{IN}$, a drain region coupled to the $V_{CC}$ voltage supply, and a source region coupled to the bias circuit and to the output terminal of the input buffer circuit. When a logic high voltage is applied to the input terminal, the n-channel transistor turns on, thereby providing an output voltage which is approximately equal to the $V_{CC}$ supply voltage. When a logic low voltage is applied to the input terminal, the bias circuit maintains a low output voltage which is approximately equal to the $V_{SS}$ supply voltage. Consequently, the gate oxide of the n-channel transistor is not exposed to high voltages. The bias circuit can be, for example, a current source. In a particular embodiment, the n-channel FET and the bias circuit form a current mirror circuit.

The invention also includes a method of using a p-channel FET in an input buffer circuit. This method includes the steps of: (1) turning the p-channel transistor on in response to a logic low input voltage, (2) turning the p-channel transistor off in response to a logic high input voltage, and (3) biasing the drain region of the p-channel transistor at a bias voltage when a logic high input voltage is applied to the gate electrode of the p-channel transistor, the bias voltage being greater than the $V_{SS}$ supply voltage and less than the $V_{CC}$ supply voltage.

A method of using an n-channel FET in an input buffer circuit includes the steps of: (1) turning the n-channel transistor on in response to a logic high input voltage, (2) turning the n-channel transistor off in response to a logic low input voltage, and (3) biasing the source region of the n-channel transistor at a bias voltage when a logic low input voltage is applied to the gate electrode of said n-channel FET, the bias voltage being approximately equal to the $V_{SS}$ supply voltage.

The present invention will be more fully understood in view of the following detailed description taken together with the drawings.

DETAILED DESCRIPTION

Figure 1:
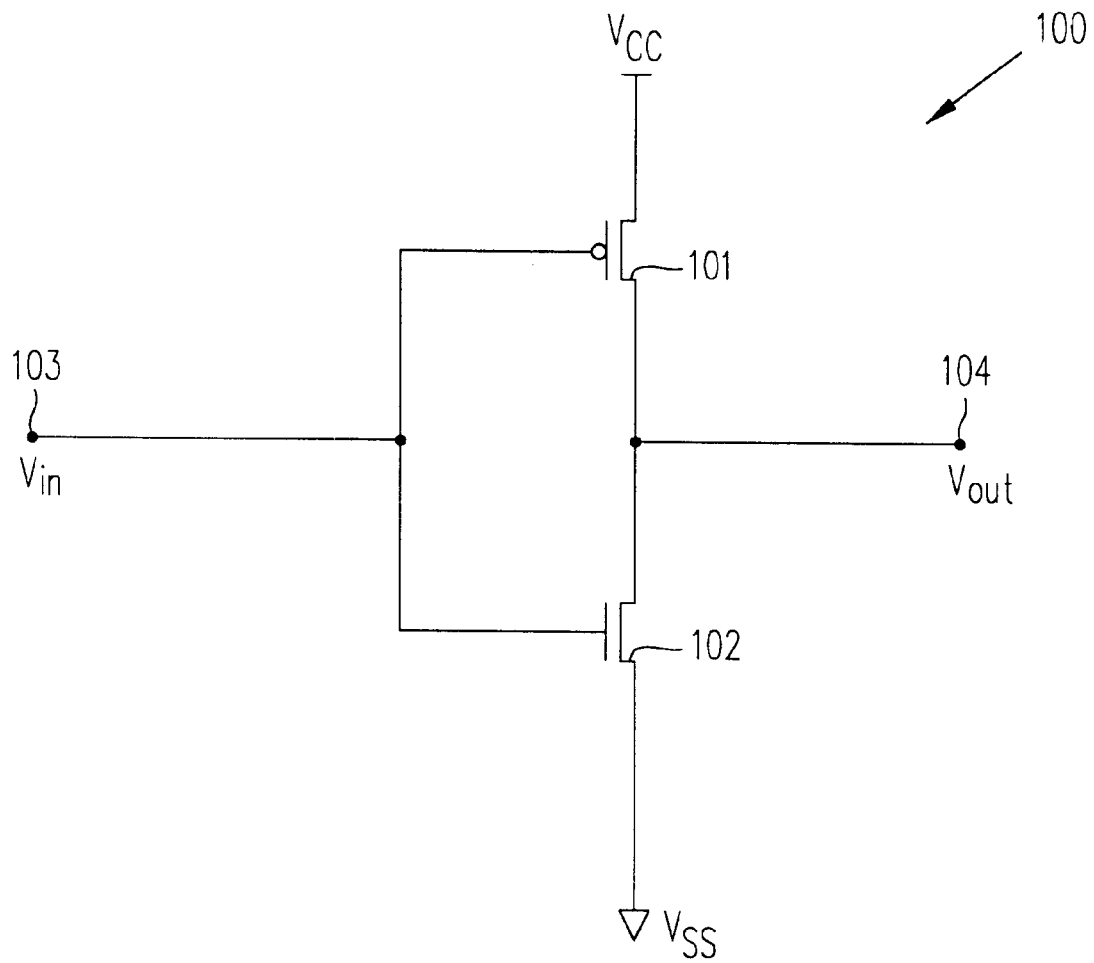
FIG. 1 is a schematic diagram of a conventional input buffer.
Figure 2:
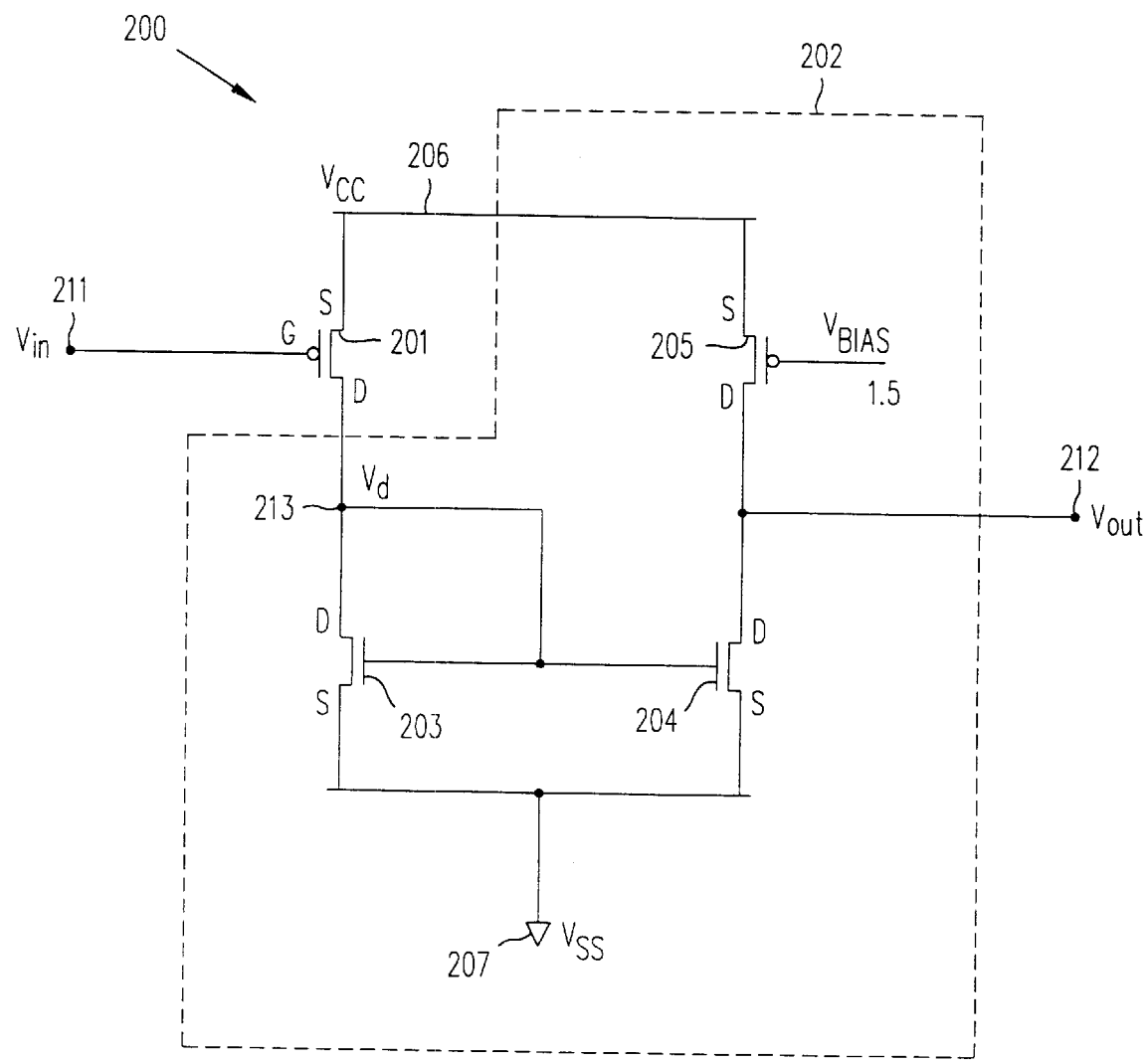
FIGS. 2–4 are schematic diagrams of input buffer circuits which include a p-channel field effect transistor and a bias circuit in accordance with variations of one embodiment of the invention.

FIG. 2 is a schematic diagram of an input buffer circuit 200 in accordance with one embodiment of the invention.

Input buffer circuit 200 includes p-channel field effect transistor (FET) 201 and bias circuit 202. Bias circuit 202 includes n-channel FETs 203–204 and p-channel FET 205. P-channel FET 201 has a source connected to $V_{CC}$ voltage supply rail 206, a drain connected to node 213, and a gate electrode coupled to input pad 211. Input pad 211 is connected to receive an external voltage $V_{IN}$ which controls input buffer circuit 200.

Transistors 203–205 of bias circuit 200 are connected as follows. The sources of transistors 203 and 204 are connected to the $V_{SS}$ voltage supply rail 207. The gate electrodes of transistors 203 and 204 are connected to common node 213. The drain of transistor 203 is also connected to node 213. The drain of transistor 204 is connected to output node 212. P-channel FET 205 has a source connected to the $V_{CC}$ voltage supply rail 206, a drain connected to output node 212 and a gate electrode coupled to receive a constant bias voltage, $V_{BIAS}$. In the described embodiment, the $V_{CC}$ supply voltage is approximately 3.3 volts and the $V_{SS}$ supply voltage is approximately 0 volts. These supply voltages can have other values in other embodiments. Output node 212 is coupled to integrated circuitry which receives the input signal applied to input pad 211.

Input buffer circuit 200 operates as follows. The bias voltage $V_{BIAS}$ applied to the gate of p-channel FET 205 is selected to allow a constant current to flow through transistor 205. Bias voltage $V_{BIAS}$ is selected to be greater than a defined logic low voltage level at input pad 211 and less than a defined logic high voltage level at input pad 211. In one embodiment, $V_{BIAS}$ is selected to be 1.5 volts. In this embodiment, an input voltage $V_{IN}$ applied to pad 211 which is less than 1.5 volts will be detected as a logic low value, and an input voltage $V_{IN}$ applied to pad 211 which is greater than 1.5 volts will be detected as a logic high value.

Transistors 201, 203, 204 and 205 form a current mirror circuit. That is, the current through transistor 201 and diode-connected transistor 203 are the same since these elements are connected in series between $V_{CC}$ voltage supply rail 206 and $V_{SS}$ voltage supply rail 207. Because the gates of transistors 203 and 204 are biased from a common node 213, and the sources of transistors 203 and 204 are connected to common $V_{SS}$ voltage supply rail 207, transistors 203 and 204 have the same gate-source voltage. Consequently, transistors 203 and 204 carry the same current. Therefore, the current through transistor 201 is equal to the current through transistor 204. The amount of current flowing through transistor 204 determines the state of the output signal $V_{OUT}$ provided at output terminal 212.

When $V_{IN}$ is at a logic low level (e.g., 0 volts), transistor 201 is turned on. As a result, a relatively large current flows through transistor 201. This same current flows through transistors 203 and 204. Thus, transistor 204 sinks a large amount of the constant current flowing through transistor 205. As a result, the output voltage $V_{OUT}$ drops to a logic low level. Note that in this embodiment, the logic low level of $V_{OUT}$ is equal to the $V_{SS}$ supply voltage. The voltage $V_D$ at node 213 is held at a level which is approximately equal to $(V_{CC}-V_{SS})/2$ (or $V_{CC}/2$). As a result, the voltage applied across the gate oxide of transistor 201 at the drain of transistor 201 is $V_{IN}$ minus $V_{CC}/2$ volts. The voltage applied across the gate oxide of transistor 201 at the source of transistor 201 is equal to $V_{IN}$ minus the $V_{CC}$ supply voltage. Thus, the voltage applied across the gate oxide of transistor 201 is at a level which will not degrade the gate oxide of transistor 201.

As $V_{IN}$ increases, the current flowing through p-channel transistor 201 decreases. As a result, the currents flowing through transistors 203 and 204 similarly decrease. As the current through transistor 204 decreases, the voltage $V_{OUT}$ increases because transistor 205 is sourcing more current to output node 212. The output voltage $V_{OUT}$ reaches a voltage level which will be interpreted to be a logic high level when the input voltage $V_{IN}$ exceeds the bias voltage $V_{BIAS}$. The voltage out $V_{OUT}$ signal is provided to other integrated circuitry (not shown) which is capable of distinguishing logic high and logic low levels from the level of the received voltage out $V_{OUT}$ signal.

When input voltage $V_{IN}$ is high (e.g., 5 volts), the voltage $V_D$ at node 213 is equal to the $V_{SS}$ supply voltage plus the threshold voltage of transistor 204, which is approximately 0.6 to 1.0 volts. The voltage across the gate oxide of transistor 201 at the drain of transistor 201 is equal to the input voltage $V_{IN}$ minus the voltage $V_D$ at node 213. Because the voltage $V_D$ at node 213 is held at a level greater than the $V_{SS}$ supply voltage, the voltage across the gate oxide of transistor 201 is advantageously reduced to a level which will not degrade the gate oxide of transistor 201.

Figure 3:
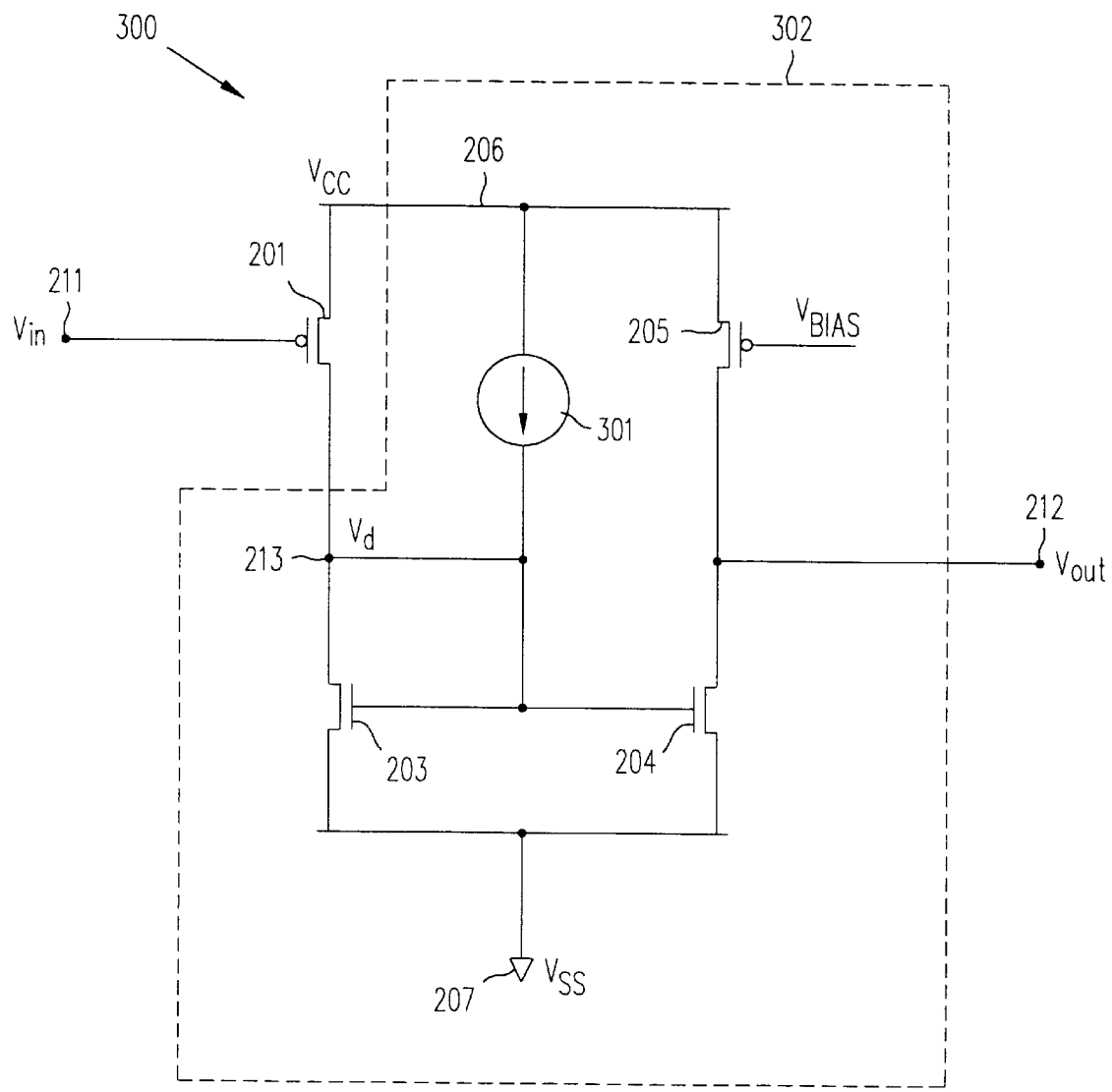

FIG. 3 is a schematic diagram of an input buffer circuit 300 in accordance with another embodiment of the invention. Because input buffer circuit 300 is substantially similar to input buffer circuit 200, similar elements in FIGS. 2 and 3 are labeled with similar reference numbers. Input buffer circuit 300 includes a bias circuit 302 which includes the same elements as bias circuit 202. In addition, bias circuit 302 includes a constant current source 301 connected in series between $V_{CC}$ voltage supply rail 206 and node 213. Current source 301 provides a small amount of current (e.g., 0.01 mA) to diode-connected transistor 203, thereby maintaining a voltage drop across transistor 203 in the desired range of 0.6 to 1.0 volts when the input voltage $V_{IN}$ is high. Input buffer circuit 302 otherwise operates in a manner similar to input buffer circuit 202.

Current source 301 can be formed using any number of known current sourcing circuits. For example, current source 301 can be a high value resistor (e.g., 100 kg) or a plurality (e.g., three or four) of series connected diodes.

Figure 4:
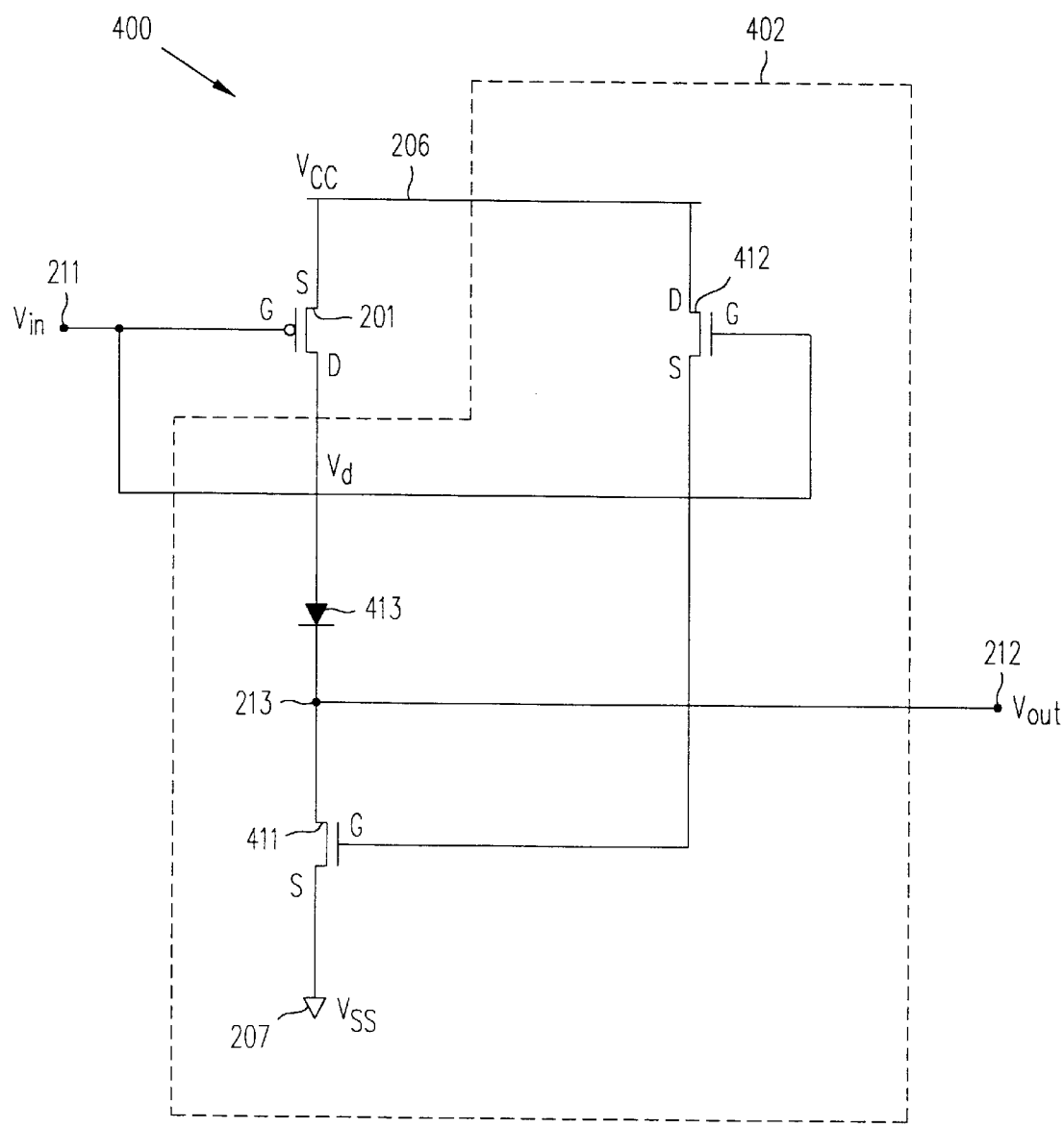

FIG. 4 is a schematic diagram illustrating an input buffer circuit 400 in accordance with another embodiment of the invention. Similar elements in FIGS. 2 and 4 are labeled with similar reference characters. Input buffer circuit 400 includes a bias circuit 402 which is made up of n-channel FETs 411 and 412 and diode 413. Transistor 411 has a drain connected to common node 213, a source connected to $V_{SS}$ voltage supply rail 207 and a gate electrode connected to the source of transistor 412. Transistor 412 has a drain connected to $V_{CC}$ voltage supply rail 206 and a gate electrode connected to input pad 211.

When the input voltage $V_{IN}$ is at a logic low level, p-channel transistor 201 turns on, thereby providing an output voltage $V_{OUT}$ approximately equal to the $V_{CC}$ supply voltage minus the voltage drop across diode 413.

When the input voltage $V_{IN}$ is at a logic high level, p-channel transistor 201 turns off and n-channel transistor 412 turns on. As a result, a logic high voltage is applied to the gate of n-channel transistor 411, thereby turning on transistor 411. When transistor 411 is turned on, the output voltage $V_{OUT}$ is approximately equal to the $V_{SS}$ supply voltage. The voltage $V_D$ at the drain of transistor 201 is approximately equal to the $V_{SS}$ supply voltage plus the voltage drop across diode 413 (e.g., 0.6 to 1.0 volts). Because the voltage at the drain of transistor 201 is higher than the $V_{SS}$ supply voltage when the input voltage $V_{IN}$ is at a logic high level, the voltage across the gate oxide at the drain of p-channel transistor 201 is advantageously held to a level which is less than the applied input voltage $V_{IN}$.

In another embodiment of the invention, an n-channel FET is connected in a source follower configuration to form a high voltage tolerant input buffer circuit. In such an embodiment, the n-channel FET has a drain connected to the $V_{CC}$ voltage supply rail, a gate electrode connected to the input pad and a source coupled to the output node. FIGS. 5–10 illustrate input buffer circuits which use an n-channel FET connected in a source follower configuration.

Figure 5:
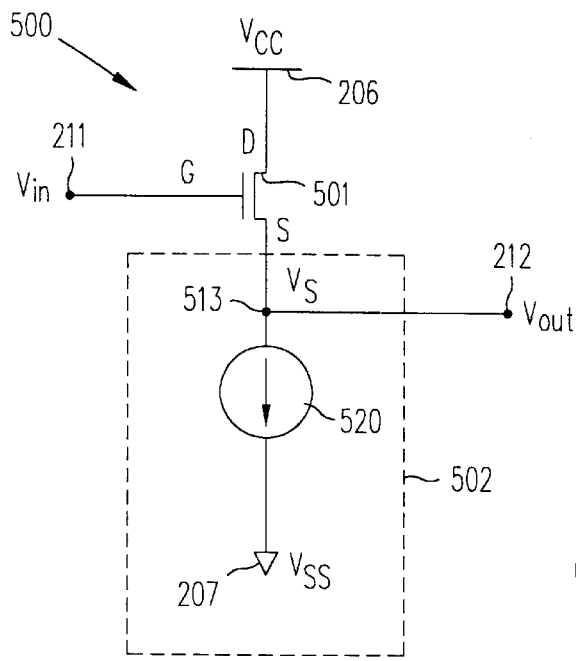
FIGS. 5–10 are schematic diagrams of input buffer circuits which include an n-channel field effect transistor and a bias circuit in accordance with variations of another embodiment of the invention.

FIG. 5 illustrates an input buffer circuit 500 which includes n-channel FET 501 and bias circuit 502. Transistor 501, which is connected in a source follower configuration, has a drain coupled to $V_{CC}$ voltage supply rail 206, a gate electrode coupled to input pad 211, and a source coupled to output node 212 through common node 513. Bias circuit 502 includes a current source 520, which is connected in series between common node 513 and $V_{SS}$ voltage supply rail 207.

When the input voltage $V_{IN}$ is at a logic high level, transistor 501 is turned on. As a result, the voltage at output node 212 is pulled up to a voltage between $V_{CC}$ supply voltage and the $V_{SS}$ supply voltage (e.g., 2 volts). This voltage is interpreted as a logic high voltage by a subsequent stage (not shown). Thus, when the input voltage $V_{IN}$ has a high level, the voltage across the gate oxide at the source of transistor 501 is maintained at a level (i.e., $V_{IN}-V_{OUT}$) which does not significantly degrade the lifetime of the gate oxide of transistor 501.

When the input voltage $V_{IN}$ is at a logic low level, transistor 501 is turned off. Under these conditions, bias circuit 502 provides a voltage to output node 212 which will be interpreted as a logic low voltage by a subsequent stage (not shown). Current source 520 introduces a voltage drop $V_{DROP}$ between common node 513 and $V_{SS}$ voltage supply rail 207. As a result, the voltage $V_{SS}$ at common node 513 is equal to the $V_{SS}$ supply voltage plus the voltage drop $V_{DROP}$ introduced by current source 520. In a particular embodiment, current source 520 is designed such that voltage drop $V_{DROP}$ is approximately equal to 0 to 1 volt.

FIGS. 6–10 illustrate various input buffer circuits which include n-channel FET 501 connected in a source follower configuration. Because the input buffer circuits of FIGS. 6–10 are similar to input buffer circuit 500 (FIG. 5), similar elements are labeled with similar reference numbers.

Figure 6:
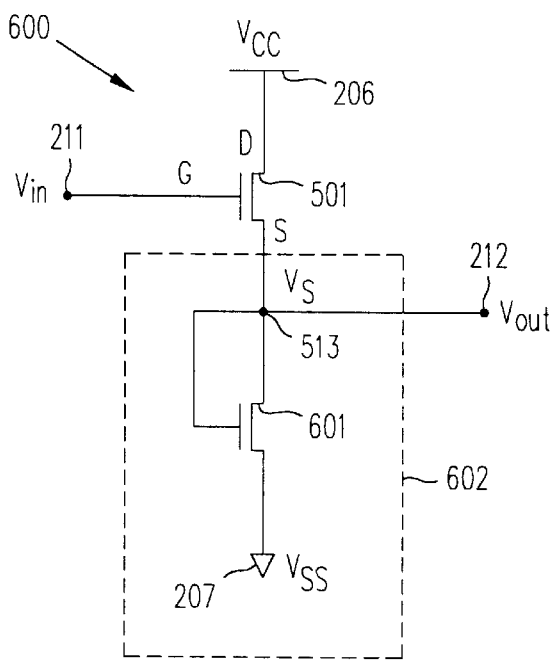

FIG. 6 illustrates an input buffer circuit 600 which includes n-channel FET 501 and bias circuit 602. Bias circuit 602 includes a current source formed from a diode connected n-channel transistor 601. Input buffer circuit 600 operates in a manner similar to input buffer circuit 500. When the input voltage $V_{IN}$ has a logic low value, the output voltage $V_{OUT}$ has a voltage which is equal to the $V_{SS}$ supply voltage plus the threshold voltage of diode connected transistor 601 (i.e., approximately 0.6 to 1.0 volts). Thus, in this embodiment, bias circuit 602 introduces a voltage drop $V_{DROP}$ equal to the threshold voltage of transistor 601.

Figure 7:
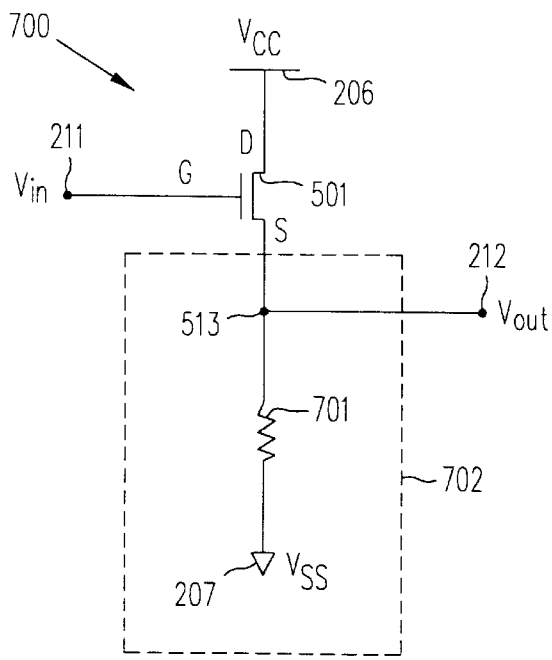

FIG. 7 illustrates an input buffer circuit 700 which includes n-channel FET 501 and bias circuit 702. Bias circuit 702 includes a current source formed using a high value resistor 701. In a particular embodiment, resistor 701 has a value on the order of a few hundred ohms. Input buffer circuit 700 operates in a manner similar to input buffer circuit 500 (FIG. 5). When the input voltage $V_{IN}$ has a logic low value, the output voltage $V_{OUT}$ has a voltage which is equal to the $V_{SS}$ supply voltage.

Figure 8:
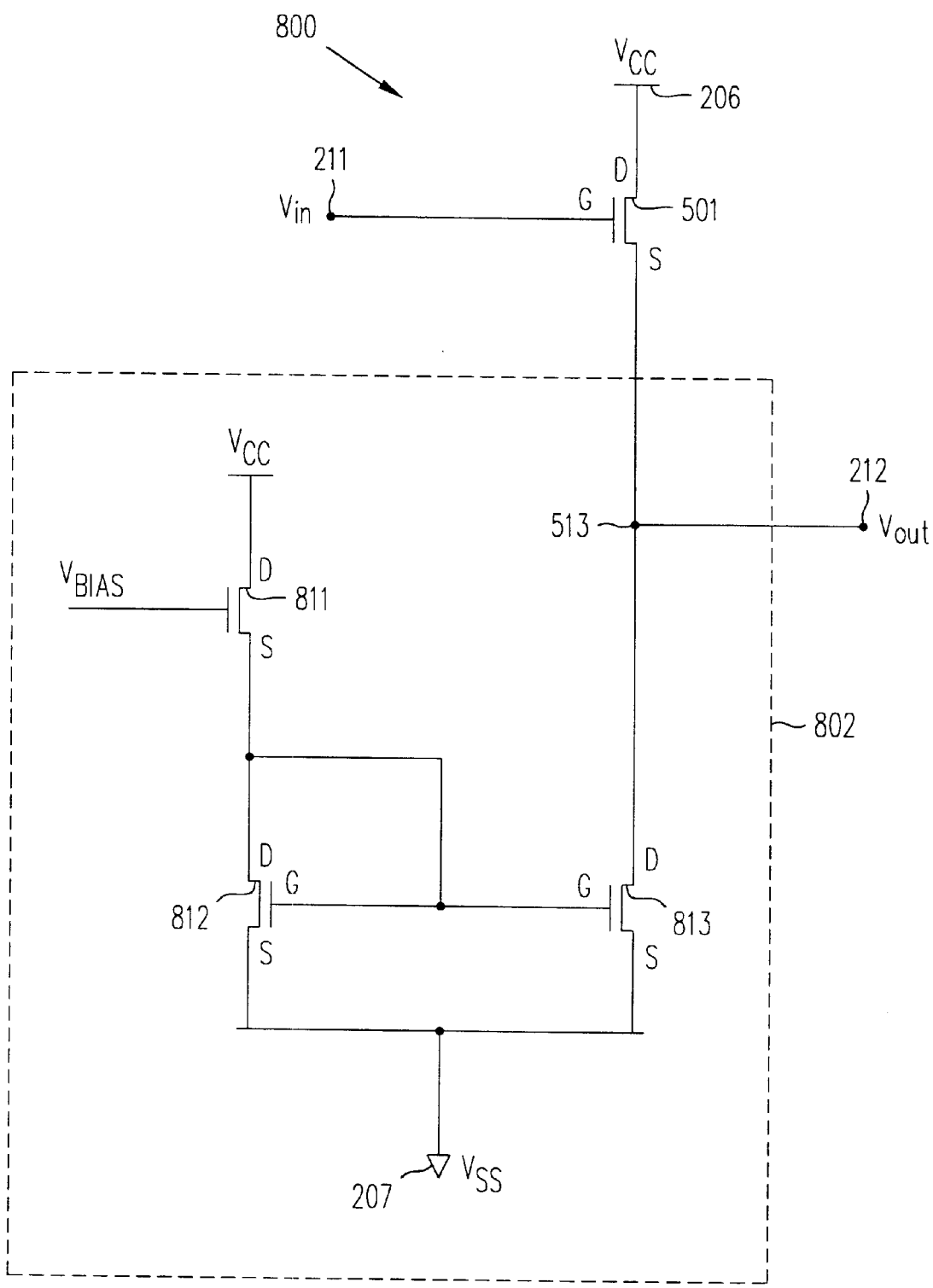

FIG. 8 illustrates an input buffer circuit 800 which includes n-channel FET 501 and bias circuit 802. Transistor 501 and bias circuit 802 form a current mirror circuit which operates in a manner similar to the current mirror circuit previously described in connection with FIG. 2. Thus, the current through transistor 811 is equal to the current through diode-connected transistor 812, which is equal to the current through transistor 813. A bias voltage $V_{BIAS}$ is applied to the gate electrode of transistor 811. This bias voltage $V_{BIAS}$ is set at a voltage level which is less than the voltage which is defined as a logic high input voltage $V_{IN}$ and greater than the voltage which is defined as a logic low input voltage $V_{IN}$. For example, if a logic high voltage is defined as a voltage greater than 2.2 volts, and a logic low voltage is defined as a voltage less than 0.8 volts, the bias voltage $V_{BIAS}$ may be set at 1.5 volts. In this example, a logic high input voltage $V_{IN}$ will cause the current through transistor 501 to exceed the current through transistor 813, thereby pulling the output voltage $V_{OUT}$ at node 212 up to a logic high level. Conversely, a logic low input voltage $V_{IN}$ will cause the current through transistor 813 to exceed the current through transistor 501, thereby pulling the output voltage $V_{OUT}$ down to a logic low level. In this case, the logic high level of output voltage $V_{OUT}$ is defined by a voltage which is approximately equal to the $V_{CC}$ supply voltage, while the logic low level of output voltage $V_{OUT}$ is defined by a voltage which is approximately equal to the $V_{SS}$ supply voltage. The circuitry coupled to the output node 212 (not shown) is designed to differentiate between these logic high and logic low levels of the output voltage $V_{OUT}$.

Figure 9:
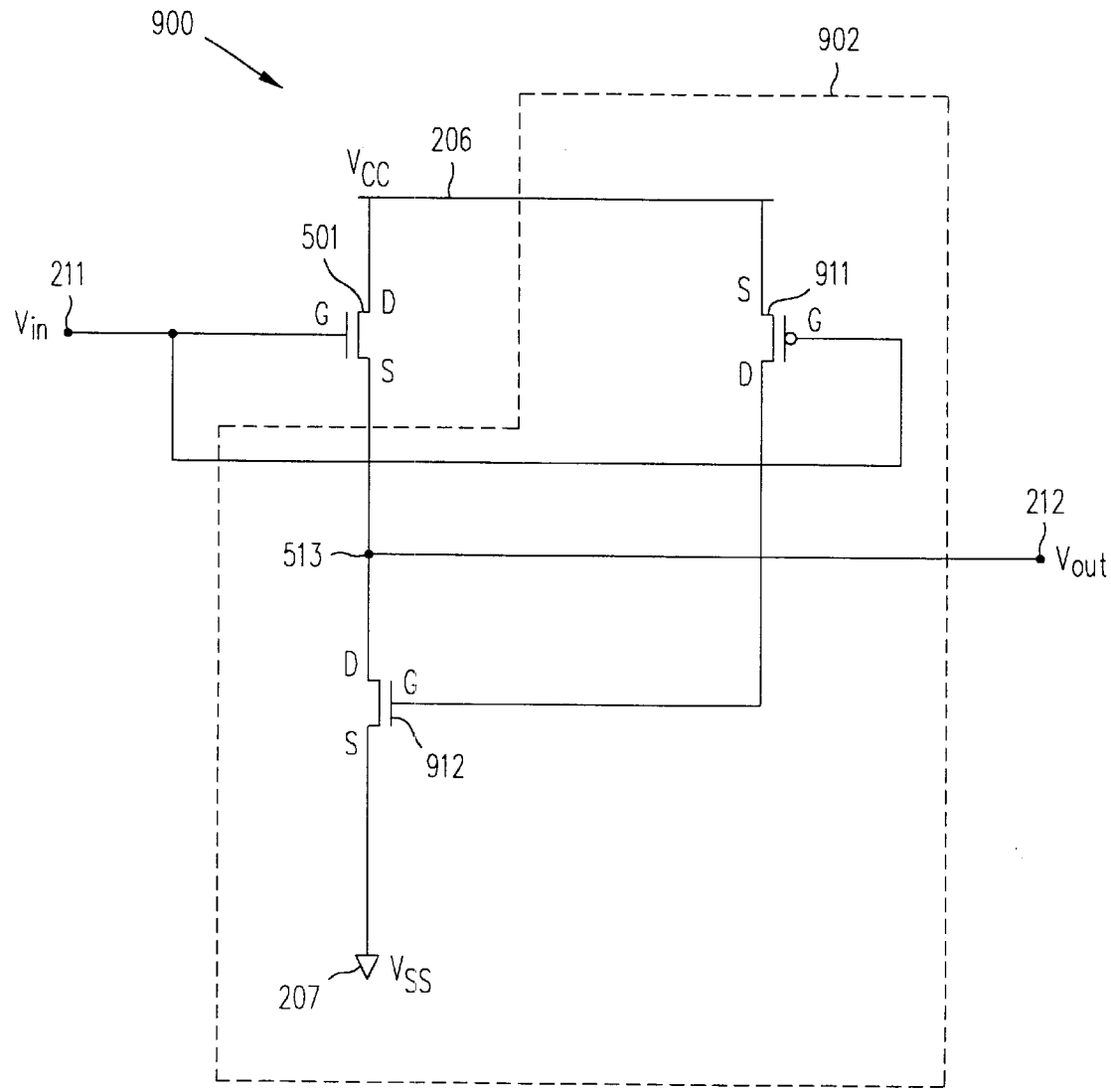

FIG. 9 illustrates an input buffer circuit 900 which includes n-channel FET 501 and bias circuit 902. Bias circuit 902 includes p-channel transistor 911 and n-channel transistor 912. Transistor 911 has a source connected to $V_{CC}$ voltage supply rail 206, a gate electrode connected to input pad 211 and a drain connected to the gate electrode of transistor 912. Transistor 912 has a drain connected to common node 513 and a source connected to $V_{SS}$ voltage supply rail 207.

When the input voltage $V_{IN}$ has a logic high value, transistor 501 turns on, thereby providing an output voltage $V_{OUT}$ equal to the $V_{CC}$ supply voltage minus the threshold voltage $V_T$ of transistor 501. When the input voltage $V_{IN}$ has a logic low value, p-channel transistor 911 is turned on, thereby coupling the gate electrode of n-channel transistor 912 to $V_{CC}$ voltage supply rail 206. As a result, transistor 912 is turned on, thereby pulling down the output voltage $V_{OUT}$ to the $V_{SS}$ supply voltage.

Figure 10:
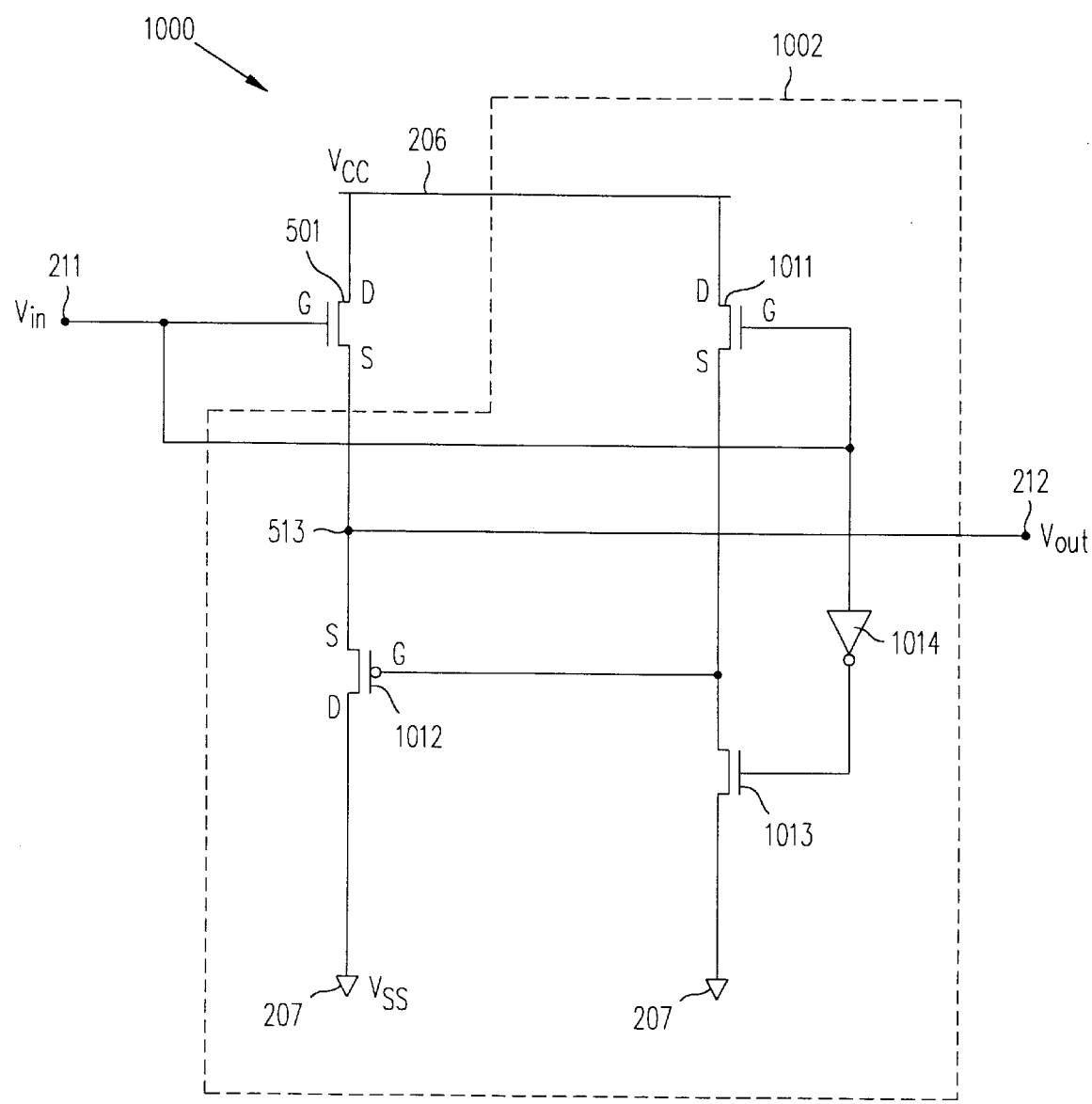

FIG. 10 illustrates an input buffer circuit 1000 which includes n-channel FET 501 and bias circuit 1002. Bias circuit 1002 includes n-channel transistors 1011 and 1013, p-channel transistor 1012 and inverter 1014. Transistor 1011 has a drain connected to $V_{CC}$ voltage supply rail 206, a gate electrode connected to input pad 211 and a drain connected to the gate electrode of transistor 1012. Transistor 1012 has a source connected to common node 513 and a drain connected to $V_{SS}$ voltage supply rail 207. Transistor 1013 has a drain connected to the gate electrode of transistor 1012, a source connected to $V_{SS}$ voltage supply rail 207 and a gate electrode connected to the output of inverter 1014. The input of inverter 1014 is coupled to input terminal 211.

When the input voltage $V_{IN}$ has a logic high value, transistor 501 turns on, thereby providing an output voltage $V_{OUT}$ equal to the $V_{CC}$ supply voltage minus the threshold voltage $V_T$ of transistor 501. Under these conditions, transistor 1011 turns on and transistor 1013 turns off, thereby connecting the gate electrode of transistor 1012 to $V_{CC}$ voltage supply rail 206. Consequently, transistor 1012 is turned off, preventing leakage current from flowing between common node 513 and $V_{SS}$ voltage supply rail 207.

When the input voltage $V_{IN}$ has a logic low value, n-channel transistor 1011 is turned off and transistor 1013 is turned on, thereby applying a voltage to the gate electrode of p-channel transistor 1012 which is approximately equal to the $V_{SS}$ supply voltage. As a result, transistor 1012 is turned on and the output voltage $V_{OUT}$ is held at a voltage which is equal to the $V_{SS}$ supply voltage. In an alternative embodiment, n-channel transistor 1013 and inverter 1014 can be replaced by an equivalent circuit, such as a resistor which is connected between the gate electrode of p-channel transistor 1012 and the $V_{SS}$ voltage supply rail 207.

Although the invention has been described in connection with several embodiments, it is understood that this invention is not limited to the embodiments disclosed, but is capable of various modifications which would be apparent to one of ordinary skill in the art. For example, other bias circuits can be designed to perform the described function of controlling the logic low voltage level of the output node of an input buffer circuit. Thus, the invention is limited only by the following claims.

What is claimed is:

1. An input buffer circuit for an integrated circuit having a first voltage supply for providing a first supply voltage and a second voltage supply for providing a second supply voltage, the first supply voltage being greater than the second supply voltage, the input buffer circuit comprising:
   an input terminal;
   an output terminal;
   a first p-channel field effect transistor (FET) having a source region connected to the first voltage supply, a drain region, and a gate electrode connected to the input terminal;
   a bias circuit connected to the drain region of the first p-channel FET and the output terminal, the bias circuit maintaining a voltage at the drain region of the first p-channel FET which is greater than the second supply voltage when a logic high voltage is applied to the input terminal, wherein the first p-channel FET and the bias circuit form a current mirror circuit which further comprises:
      a first n-channel transistor having a drain region and a gate electrode connected to the drain region of the first p-channel transistor and a source region connected to the second voltage supply;
      a second n-channel transistor having a gate electrode connected to the drain region of the first p-channel transistor, a source region connected to the second voltage supply and a drain region connected to the output terminal; and
      a second p-channel transistor having a drain region connected to the output terminal, a source region connected to the first voltage supply, and a gate electrode connected to receive a bias voltage which is less than the first supply voltage and greater than the second supply voltage; and
      only one current source connected between the first voltage supply and the drain region of the first p-channel transistor, wherein the current source provides substantially 0.1 mA of current, wherein the one current source is the only current source in the bias circuit, and wherein the current source comprises a plurality of series connected diodes.

2. An input buffer circuit for an integrated circuit having a first voltage supply for providing a first supply voltage and a second voltage supply for providing a second supply voltage, the first supply voltage being greater than the second supply voltage, the input buffer circuit comprising:
   an input terminal;
   an output terminal;
   a first p-channel field effect transistor (FET) having a source region connected to the first voltage supply, a drain region, and a gate electrode connected to the input terminal;
   a bias circuit connected to the drain region of the first p-channel FET and the output terminal, the bias circuit maintaining a voltage at the drain region of the first p-channel FET which is greater than the second supply voltage when a logic high voltage is applied to the input terminal, wherein the first p-channel FET and the bias circuit form a current mirror circuit which further comprises:
      a first n-channel transistor having a drain region and a gate electrode connected to the drain region of the first p-channel transistor and a source region connected to the second voltage supply;
      a second n-channel transistor having a gate electrode connected to the drain region of the first p-channel transistor, a source region connected to the second voltage supply and a drain region connected to the output terminal; and
      a second p-channel transistor having a drain region connected to the output terminal, a source region connected to the first voltage supply, and a gate electrode connected to receive a bias voltage which is less than the first supply voltage and greater than the second supply voltage; and
      only one current source connected between the first voltage supply and the drain region of the first p-channel transistor, wherein the one current source is the only current source in the bias circuit, and wherein the current source comprises three series connected diodes.

3. An input buffer circuit for an integrated circuit having a first voltage supply for providing a first supply voltage and a second voltage supply for providing a second supply voltage, the first supply voltage being greater than the second supply voltage, the input buffer circuit comprising:
   an input terminal;
   an output terminal;
   a first p-channel field effect transistor (FET) having a source region connected to the first voltage supply, a drain region, and a gate electrode connected to the input terminal;
   a bias circuit connected to the drain region of the first p-channel FET and the output terminal, the bias circuit maintaining a voltage at the drain region of the first p-channel FET which is greater than the second supply voltage when a logic high voltage is applied to the input terminal, wherein the first p-channel FET and the bias circuit form a current mirror circuit which further comprises:
      a first n-channel transistor having a drain region and a gate electrode connected to the drain region of the first p-channel transistor and a source region connected to the second voltage supply;
      a second n-channel transistor having a gate electrode connected to the drain region of the first p-channel transistor, a source region connected to the second voltage supply and a drain region connected to the output terminal; and
      a second p-channel transistor having a drain region connected to the output terminal, a source region connected to the first voltage supply, and a gate electrode connected to receive a bias voltage which is less than the first supply voltage and greater than the second supply voltage; and only one current source connected between the first voltage supply and the drain region of the first p-channel transistor, wherein the one current source is the only current source in the bias circuit, and wherein the current source comprises four series connected diodes.

4. An input buffer circuit for an integrated circuit having a first voltage supply for providing a first supply voltage and a second voltage supply for providing a second supply voltage, the first supply voltage being greater than the second supply voltage, the input buffer circuit comprising:

an input terminal;

an output terminal;

a first p-channel field effect transistor (FET) having a source region connected to the first voltage supply, a drain region, and a gate electrode connected to the input terminal;

a bias circuit connected to the drain region of the first p-channel FET and the output terminal, the bias circuit maintaining a voltage at the drain region of the first p-channel FET which is greater than the second supply voltage when a logic high voltage is applied to the input terminal, wherein the first p-channel FET and the bias circuit form a current mirror circuit which further comprises:

a first n-channel transistor having a drain region and a gate electrode connected to the drain region of the first p-channel transistor and a source region connected to the second voltage supply;

a second n-channel transistor having a gate electrode connected to the drain region of the first p-channel transistor, a source region connected to the second voltage supply and a drain region connected to the output terminal; and a second p-channel transistor having a drain region connected to the output terminal, a source region connected to the first voltage supply, and a gate electrode connected to receive a bias voltage which is less than the first supply voltage and greater than the second supply voltage; and only one current source connected between the first voltage supply and the drain region of the first p-channel transistor, wherein the current source provides substantially 0.1 mA of current, wherein the one current source is the only current source in the bias circuit, and wherein the current source comprises a resistor.

5. An input buffer circuit for an integrated circuit having a first voltage supply for providing a first supply voltage and a second voltage supply for providing a second supply voltage, the first supply voltage being greater than the second supply voltage, the input buffer circuit comprising:

an input terminal;

an output terminal;

a first p-channel field effect transistor (FET) having a source region connected to the first voltage supply, a drain region, and a gate electrode connected to the input terminal;

a bias circuit connected to the drain region of the first p-channel FET and the output terminal, the bias circuit maintaining a voltage at the drain region of the first p-channel FET which is greater than the second supply voltage when a logic high voltage is applied to the input terminal, wherein the first p-channel FET and the bias circuit form a current mirror circuit which further comprises:

a first n-channel transistor having a drain region and a gate electrode connected to the drain region of the first p-channel transistor and a source region connected to the second voltage supply;

a second n-channel transistor having a gate electrode connected to the drain region of the first p-channel transistor, a source region connected to the second voltage supply and a drain region connected to the output terminal; and a second p-channel transistor having a drain region connected to the output terminal, a source region connected to the first voltage supply, and a gate electrode connected to receive a bias voltage which is less than the first supply voltage and greater than the second supply voltage; and only one current source connected between the first voltage supply and the drain region of the first p-channel transistor, wherein the one current source is the only current source in the bias circuit, and wherein the current source comprises a resistor having a resistance of at least 100 k$\Omega$.

* * * * *